Dec. 28, 1965 J. J. WILTING 3,226,655
CIRCUIT ARRANGEMENT FOR STARTING A SELF-GENERATING THYRISTOR OSCILLATOR
Filed Feb. 1, 1962

INVENTOR
JOHANNES J. WILTING
BY Frank R. Trifari
AGENT 3,226,655

CIRCUIT ARRANGEMENT FOR STARTING A SELF-GENERATING THYRISTOR OSCILLATOR

Johannes Jacobus Wilting, Emmasingel, Eindhoven, Netherlands, assignor to North American Philips Company, Inc., New York, N.Y., a corporation of Delaware Filed Feb. 1, 1962, Ser. No. 170,372
Claims priority, application Netherlands, Feb. 2, 1961, 260,777
11 Claims. (Cl. 331—113)

This invention relates to self-generating oscillators using controlled semi-conductor rectifiers, also known as thyristors, as the active elements. Such oscillators can be used, for example, in converters, inverters, choppers or the like. More particularly, the invention relates to a circuit arrangement for starting a self-generating thyristor oscillator.

The thyristor in such an oscillator acts as a switch and is either in a conductive or a non-conductive state. It can be brought from one condition to the other only by means of its control electrode; however, the current passed while in the conducting state cannot be varied by the control electrode. It is therefore usually necessary to start self-generating thyristor oscillators by means of an electric pulse applied to the control-electrode of the thyristor. It is only after the thyristor has become conducting that the oscillator can operate in a self-generating manner, usually by a feed-back arrangement. Starting may be brought about simply by means of a switching-on current pulse; this, however, does not provide a reliable method of operation.

It is an object of the present invention to provide a circuit arrangement for starting a self-generating thyristor oscillator which is reliable and positive in operation and is comparatively simple and economical in the use of components.

It is a further object of the invention to provide a circuit arrangement in which reliable means are provided to insure that the starting arrangement is put out of operation once oscillations have started, thereby avoiding disturbance of the oscillator operation after starting.

In accordance with one aspect of the invention, a capacitor is connected across the direct voltage source through a resistor, and a non-linear element is connected in series with a direct-current conductive impedance across the capacitor; at a given value of voltage across the capacitor, the non-linear element becomes conductive and a pulse is produced across the impedance which is fed to a control electrode of a thyristor of the oscillator.

In accordance with another aspect of the invention, a rectifier is provided which is coupled to one of the main current electrodes of a transistor and to the capacitor in a manner such that current pulses are fed to the capacitor with a polarity such that the voltage across the capacitor remains lower than the ignition voltage of the non-linear element; this arrangement puts the starting circuit out of operation once the circuit starts oscillating.

The invention will be described more fully with reference to the drawing, in which.

Figure 1:
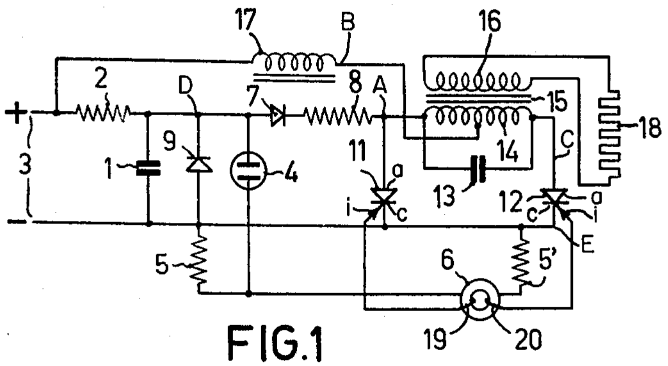
FIG. 1 shows a first embodiment of the starting circuit arrangement according to the invention.

The first embodiment shown in FIG. 1 comprises a capacitor 1, which is connected to a direct voltage source 3 via a resistor 2. It further comprises a non-linear element formed by a gas discharge tube 4 which, in series with a resistor 5, is connected across the capacitor 1; the resistor 5 is generally small, with a resistance having an order of magnitude in the tens of ohms.

FIG. 1 also shows a self-generating thyristor oscillator, i.e. a self-generating thyristor inverter. The thyristor inverter comprises two push-pull connected thyristors 11 and 12, the cathodes *c* of which are connected directly to the negative terminal of the supply source 3 and the anodes or hook collectors *a* of which are connected to each other through a resonant circuit consisting of a capacitor 13 and of the primary winding 14 of a transformer 15, the latter having a secondary winding 16. The primary winding 14 is provided with a center tap which is connected to the positive terminal of the source 3 by an inductor 17. A load 18, for example a fluorescent gas discharge tube, is connected to the secondary winding 16. Two windings 19 and 20, provided on a core 6 composed of ferromagnetic material, also form part of the thyristor inverter. By means of these windings, the circuits of the control (or ignition) electrodes *i* of the thyristors 11 and 12 are coupled in phase opposition to one another, so that the inverter is caused to self-oscillate. This inverter is of the type described in the prior U.S. application Serial No. 167,493, filed January 22, 1962, and its operation is based on the fact that the conducting period of each of the thyristors 11 and 12 is determined by the series resonant circuit formed by the inductor 17 and the capacity which the resonant circuit 14, 13 exhibits at the operational frequency across the half of the winding 14 corresponding to the conducting thyristor; the operation is also governed by the occurrence of a strong reverse current pulse through the control-circuit of each extinguishing thyristor. This reverse current pulse, for example through the winding 19, produces, possibly with a short time delay, a forward current pulse through the winding 20 and the latter current pulse renders the other thyristor 12 conducting at the instant when the thyristor 11 extinguishes or a short time thereafter.

Although the starting arrangement according to the present invention is described here in connection with an inverter of a specific type, it should be understood that it can be used for starting self-generating thyristor oscillators of any type.

Connecting the thyristor inverter of FIG. 1 to the voltage source 3 does not produce a sufficiently strong voltage or current pulse for rendering one of the thyristors 11 or 12 conducting. Since the series combination of the capacitor 1 and of the resistor 2 is connected to the voltage source simultaneously with the inverter, the capacitor 1 is charged comparatively slowly to the voltage of this source.

At a given instant the voltage across this capacitor and hence also the voltage across the gas discharge tube 4 connected in parallel with the capacitor 1 via the resistor 5, attains a value at which this gas discharge tube becomes abruptly conducting. It is known that the ignition voltage of a gas discharge tube is higher than its burning voltage, i.e. than the voltage across the ignited or conducting gas discharge tube. The capacitor 1 therefore discharges via the gas discharge tube 4 and the resistor 5 and the voltage pulse across this resistor produces a forward current pulse through the winding 19 and the control-electrode circuit of the thyristor 11. The thyristor 11 is thus rendered conducting. Owing to the series resonance properties of the main current circuit of this thyristor consisting of the inductor 17 and the corresponding half of the resonant circuit 13, 14, the current flowing through the main current electrode path of the thyristor 11 passes through zero after half an oscillation period of the series resonant circuit. The thyristor 11 then extinguishes and a reverse current pulse passes from its control-electrode through the winding 19 and the resistor 5. This reverse current pulse induces a forward current pulse into the winding 20 and the series-connected resistor 5 and the forward current pulse ignites the thyristor 12. From this instant onward, the thyristor inverter is self-oscillating. From the anode or hook collector of one of the thyristors, for example, that of the thyristor 11, negative current pulses are supplied to the junction of the capacitor 1 and the resistor 2 via a current limiting resistor 8 and a rectifier 7. These pulses charge the upper electrode of the capacitor 1 negatively, so that this electrode can at any rate not become so strongly positively charged via the resistor 2 and with respect to the lower electrode of the capacitor 1 that the gas discharge tube 4 is ignited by the voltage across the capacitor 1. The starting circuit arrangement is then out of operation owing to self-oscillation of the thyristor inverter. If this self-oscillation ceases for any reason, the starting circuit arrangement immediately becomes operative again and periodically produces current pulses across the resistor 5, until the thyristor inverter again becomes self-oscillating.

Under certain conditions, the negative current pulses applied to the capacitor 1 via the resistor 8 and the rectifier 7 could be so strong that the potential of the junction of the capacitor 1 and of the resistor 2 would be negative with respect to the negative terminal of the voltage source 3, and this negative voltage across the capacitor 1 could even become high enough to ignite the gas discharge tube 4. This would in turn produce untimely and unwanted starting pulses across the resistor 5. In order to avoid this a rectifier 9 is connected across the capacitor 1. This rectifier is cut off for the charging voltage of the polarity of the voltage from the source 3 and passes current pulses from the hook collector of the thyristor 11 via the resistor 8 and the rectifier 7. In operation, the capacitor 1 can therefore not be charged by current pulses having a polarity opposite to that of the voltage of the source 3.

Figure 2:
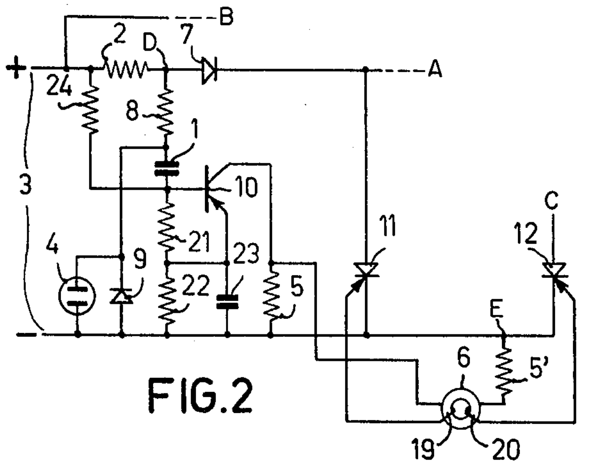
FIG. 2 shows a second embodiment

The second embodiment shown in FIG. 2 differs from the first embodiment in that the current pulses produced by the discharge of the capacitor 1 via the gas discharge tube 4 are amplified with the aid of a transistor 10 of the pnp-type before they are supplied to the resistor 5. The direct-current conductive impedance connected in series with the gas discharge tube 4 across the capacitor 1 consists of the series combination of two resistors 21 and 22, the resistor 22 being shunted by a capacitor 23. The junction of the resistors 21 and 22 and of the capacitor 23 is connected to the emitter electrode of the transistor 10 and the base of this transistor is connected to the junction of the capacitor 1 and of the resistor 21; the latter junction is also connected to the positive terminal of the voltage source 3 via a resistor 24. The collector of the transistor 10 is connected to the negative terminal of the supply source 3 via the resistor 5. Finally, the current limiting resistor 8 of the first embodiment is connected on the other side of the rectifier 7 and included in the charging current circuit of the capacitor 1, so that it contributes to increase the time constant of the starting circuit arrangement, i.e. the charging time of the capacitor 1. The portion of the inverter including transformer 14 and capacitor 13 has not been shown in FIG. 2 since this portion is the same as that of FIG. 1. The corresponding connections to be made are indicated in the figures by the letters A, B, C, D, E.

The resistors 24, 21 and 22 constitute a voltage divider, by means of which the emitter of the transistor 10 is held at a positive potential with respect to its collector and the base of this transistor is normally positively biased relatively to its emitter. When the capacitor 1 discharges via the resistors 21 and 22 and the gas discharge tube 4, the discharge current pulse produces a voltage pulse across the resistor 21, whereas the voltage across the resistor 22 is stabilized by the capacitor 23 and has very little variation. This voltage pulse drives the base of the transistor 10 shortly and strongly in the forward direction, so that the transistor 10 becomes conducting and a current pulse flows through the resistor 5. This current pulse again produces a forward current pulse through the winding 19 and the control-electrode circuit of the thyristor 11 and thus ignites this thyristor. The rectifier 7 again ensures that, with the oscillator generating, the capacitor 1 is not charged positively to a sufficient extent to produce a discharge via the gas discharge tube 4, while the rectifier 9 prevents the building up of a negative voltage at the junction of this capacitor and of the gas discharge tube 4.

Figure 3:
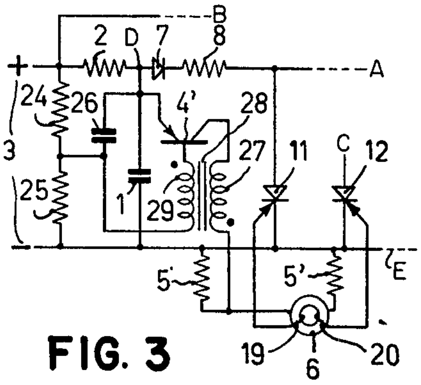
FIG. 3 shows a third embodiment.

The third embodiment shown in FIG. 3 differs from that shown in FIG. 1 in that the non-linear element formed by the gas discharge tube 4 is replaced by the emitter-collector electrode path of a transistor 4' of the pnp-type, having a strong feedback applied thereto by means of a transformer 28 with a primary winding 27 and a secondary winding 29. The resistor 5, in series with the primary winding 27, is included in the collector circuit of this transistor. Its emitter is connected to the junction of the capacitor 1 and of the resistor 2 and its base is connected, via the secondary winding 29, to the tap of a resistive voltage-divider connected across the supply source 3 and consisting of resistors 24 and 25. Finally this tap is capacitively coupled to the junction of the capacitor 1 and of the resistor 2 by means of a capacitor 26. The portion of the inverter including transformer 14 and capacitor 13 has not been shown in FIG. 3 since this portion is the same as that of FIG. 1. As for FIG. 2, the corresponding connections to be made are indicated by the letters A, B, C, D, E.

The values of the resistors 2, 24 and 25 and of the capacitors 1 and 26 are chosen so that, when the circuit arrangement is connected to the voltage source 3, the positive potential at the junction of the capacitor 1 and of the resistor 2 increases first more slowly than that at the tapping of the voltage-divider 24, 25. The last-mentioned potential can, however, not exceed a given value determined by the ratio between the resistors 24 and 25 and, at a given instant, the junction of the capacitor 1 and the resistor 2 becomes positive with respect to the tap of the voltage-divider 24, 25. The emitter of the transistor 4' then also becomes positive with respect to its base and, since this transistor is strongly fed back, it becomes abruptly very strongly conducting and passes a strong current pulse through the resistor 5. This pulse in turn produces a forward current pulse through the winding 19 and the control-electrode circuit of the thyristor 11 and ignites this thyristor. As in the embodiment shown in FIG. 1, the rectifier 7 and the resistor 8 ensure that the capacitor 1 is not charged positively to a sufficient extent to render the transistor 4' conducting when the oscillator is generating. In this embodiment, a rectifier connected across the capacitor 1 such as the rectifier 9 of FIG. 1 may of course be dispensed with.

Figure 4:
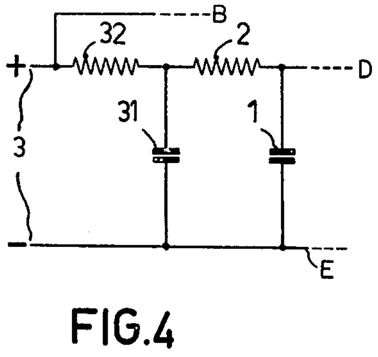
FIG. 4 shows a modification which may be used with each of the embodiments shown.

Under certain conditions it may be desirable to prolong or to vary at will the time delay between the connection of the starting circuit arrangement and the self-generating oscillator to be started to the voltage source 3 and the production of the first starting pulse. This may, for example, be the case when the heated cathodes of luminescent tubes are to be preheated with the aid of an auxiliary generator before applying the ignition voltage and the burning voltage to these tubes. Such a preheating increases the life of such luminescent tubes. This prolongation and/or variation of time delay may be readily obtained with the aid of a further resistor-capacitor network. As shown in FIG. 4 such a modification comprises a second capacitor 31 and a second resistor 32, the resistor 32 being connected in series with the resistor 2 and the capacitor 31 being connected to the junction of these resistors, while the self-generating oscillator is again directly connected to the positive and negative terminals of the voltage source 3. Corresponding connections to be made are again indicated by the letters B, D and E. It will be apparent to those skilled in the art that more than two cascade-connected resistor-capacitor networks could be used and/or at least one of the resistors and/or of the capacitors of these networks could be designed as a variable element so that the time delay could thereby be controlled at will.

While the invention has been described with respect to specific embodiments, various modifications and variations thereof will be readily apparent to those skilled in the art without departing from the inventive concept, the scope of which is set forth in the appended claims.

What is claimed is:

1. A circuit arrangement for starting a self-generating thyristor oscillator, comprising: a thyristor oscillator including two push-pull connected thyristors each having a cathode, an anode, and a control electrode, the cathodes being coupled to one terminal of a direct voltage supply source and the anodes being coupled together by an inductive winding, a capacitor and a resistor connected in series across the two terminals of said supply source, a non-linear element having a threshold voltage and a direct current conductive impedance connected in series with each other across said capacitor, a rectifier, one terminal of said non-linear element being coupled to one of said anodes through said rectifier, the other terminal of said non-linear element being connected to the control electrode of one thyristor, said non-linear element becoming conductive when the voltage across the capacitor reaches a given value and producing a pulse across said impedance which is fed to the control electrode of said one thyristor to effectuate the starting of said oscillator, said rectifier having a polarity such that current pulses from the generating oscillator are fed to the capacitor with a polarity such that the voltage across the capacitor remains lower than the threshold voltage of the non-linear element when the oscillator is generating.

2. A circuit arrangement as claimed in claim 1, wherein the non-linear element is a gas discharge tube.

3. A circuit arrangement as claimed in claim 1, further including a resistive voltage divider connected across said supply source, said non-linear element comprising the emitter-collector electrode path of a transistor having a base electrode, circuit means for producing a regenerative feedback coupling between said emitter-collector electrode path and said base electrode, the emitter electrode of said transistor being connected to the junction of said capacitor and said resistor, the base electrode of said transistor being coupled to a tap on said voltage divider.

4. A circuit arrangement for starting a self-generating thyristor oscillator, comprising: a thyristor oscillator including two push-pull connected thyristors each having a cathode, an anode, and a control electrode, the cathodes being coupled to one terminal of a direct voltage supply source and the anodes being coupled together by an inductive winding, a capacitor and a resistor connected in series across the two terminals of said supply source, a non-linear element having a threshold voltage and a direct current conductive impedance connected in series with each other across said capacitor, first and second rectifiers, one terminal of said non-linear element being coupled to one of said anodes through said first rectifier, the other terminal of said non-linear element being connected to the control electrode of one thyristor, said second rectifier being connected across said capacitor, said non-linear element becoming conductive when the voltage across the capacitor reaches a given value and producing a pulse across said impedance which is fed to the control electrode of said one thyristor to effectuate the starting of said oscillator, said first and second rectifiers being connected with the same relative polarities such that current pulses from the generating oscillator are fed to the capacitor with a polarity such that the voltage across the capacitor remains lower than the threshold voltage of the non-linear element when the oscillator is generating and the capacitor is prevented from being charged by current pulses from the oscillator having a polarity opposite to that of said voltage source.

5. A circuit arrangement as claimed in claim 4, wherein the non-linear element is a gas discharge tube.

6. A circuit arrangement for starting a self-generating thyristor oscillator including at least one thyristor having cathode, anode and control electrodes, a control circuit coupled to said cathode and control electrodes and an output circuit coupled to said cathode and anode electrodes, said arrangement comprising a direct voltage source, a capacitor and a resistor connected in series with each other across said voltage source, a direct-current conductive impedance and a non-linear element having a threshold voltage connected in series with each other across said capacitor, said non-linear element becoming conductive when the voltage across the capacitor reaches a given value and producing a starting pulse across said impedance when the voltage set up across said capacitor by said direct voltage source reaches the value of said threshold voltage, a circuit intercoupling said direct-current conductive impedance and said control circuit of said thyristor for feeding said starting pulse thereto, and a rectifier connected between a point at varying potential of said output circuit and the junction point of said capacitor and said resistor, said rectifier having a polarity such that oscillations set up in said output circuit charge said capacitor with a voltage having a polarity opposite to that of the voltage set up across said capacitor by said direct voltage source, whereby the resulting voltage across said capacitor remains lower than said threshold voltage when the oscillator is generating.

7. A circuit arrangement as claimed in claim 6, wherein the non-linear element is a gas discharge tube.

8. A circuit arrangement as claimed in claim 6, further including a resistive voltage divider connected across said supply source, said non-linear element comprising the emitter-collector electrode path of a transistor having a base electrode, circuit means for producing a regenerative feedback coupling between said emitter-collector electrode path and said base electrode, the emitter electrode of said transistor being connected to the junction of said capacitor and said resistor, the base electrode of said transistor being coupled to a tap on said voltage divider.

9. A circuit arrangement for starting a self-generating thyristor oscillator including at least one thyristor having cathode, anode and control electrodes, a control circuit coupled to said cathode and control electrodes and an output circuit coupled to said cathode and anode electrodes, said arrangement comprising a direct voltage source, a capacitor and a resistor connected in series with each other across said voltage source, a direct-current conductive impedance and a non-linear element having a threshold voltage connected in series with each other across said capacitor, said non-linear element becoming conductive when the voltage across the capacitor reaches a given value and producing a starting pulse across said impedance when the voltage set up across said capacitor by said direct voltage source reaches the value of said threshold voltage, a circuit intercoupling said direct-current conductive impedance and said control circuit of said thyristor for feeding said starting pulse thereto, a first rectifier connected between a point at varying potential of said output circuit and the junction point of said capacitor and said resistor, a second rectifier connected across said capacitor, said first and second rectifiers being connected with the same relative polarities such that oscillations set up in said output circuit charge said capacitor via said first rectifier with a polarity opposite to that of the voltage set up across said capacitor by said direct voltage source and such that said second rectifier prevents said capacitor from being charged by current pulses from the oscillator with a polarity opposite to that of said voltage source, the resulting voltage across said capacitor thereby remaining lower than said threshold voltage when the oscillator is generating.

10. A circuit arrangement as claimed in claim 9, wherein the non-linear element is a gas discharge tube.

11. A circuit arrangement for starting a self-generating thyristor oscillator including at least one thyristor having cathode, anode and control electrodes, a control circuit coupled to said cathode and control electrodes and an output circuit coupled to said cathode and anode electrodes, said arrangement comprising a direct voltage source, a capacitor and a resistor connected in series with each other across said voltage source, a direct-current conductive impedance and a non-linear element having a threshold voltage connected in series with each other across said capacitor, a transistor amplifier having an input terminal and an output terminal, a biasing circuit for maintaining said transistor in a normally non-conducting condition, said direct current conductive impedance being coupled to said input terminal, said non-linear element becoming conductive when the voltage across the capacitor reaches a given value and producing a starting pulse across said impedance causing the transistor to conduct when the voltage set up across said capacitor by said direct voltage source reaches the value of said threshold voltage, a circuit intercoupling said output terminal and said control circuit of said thyristor for feeding said starting pulse thereto, and a rectifier connected between a point at varying potential of said output circuit and the junction point of said capacitor and said resistor, said rectifier having a polarity such that oscillations set up in said output circuit charge said capacitor with a voltage having a polarity opposite to that of the voltage set up across said capacitor by said direct voltage source, whereby the resulting voltage across said capacitor remains lower than said threshold voltage when the oscillator is generating.

References Cited by the Examiner

FOREIGN PATENTS 722,234 3/1932 France.

OTHER REFERENCES

"Silicon Controlled Rectifier Inverters," by Jones et al., presented at 1959 Solid-State Circuits Conference, February 1959, pages 50, 51.

ROY LAKE, *Primary Examiner.*

JOHN KOMINSKI, *Examiner.*